US006795557B1

(12) United States Patent
Mäkivirta et al.

(10) Patent No.: US 6,795,557 B1
(45) Date of Patent: Sep. 21, 2004

(54) SOUND REPRODUCTION EQUIPMENT AND METHOD FOR REDUCING THE LEVEL OF ACOUSTICAL REFLECTIONS IN A ROOM

(75) Inventors: Aki Mäkivirta, Lapinlahti (FI); Ari Varla, Iisalmi (FI)

(73) Assignee: Genelec Oy, Iisalmi (FI)

( * ) Notice: Subject to any disclaimer, the term of this patent is extended or adjusted under 35 U.S.C. 154(b) by 0 days.

(21) Appl. No.: 09/701,988

(22) PCT Filed: Jun. 17, 1999

(86) PCT No.: PCT/FI99/00534

§ 371 (c)(1), (2), (4) Date: Dec. 6, 2000

(87) PCT Pub. No.: WO99/66492

PCT Pub. Date: Dec. 23, 1999

(30) Foreign Application Priority Data

Jun. 17, 1998 (FI) ................................................ 981409

(51) Int. Cl.[7] ............................ H04B 3/20; H03B 29/00
(52) U.S. Cl. ........................................ 381/66; 381/71.1
(58) Field of Search ............................... 381/71.1, 71.2, 381/71.8, 71.9, 73.1, 94.1, 94.2, 66

(56) References Cited

U.S. PATENT DOCUMENTS 4,899,387 A 2/1990 Pass
5,559,891 A * 9/1996 Kuusama et al. ............. 381/63
5,832,095 A * 11/1998 Daniels ..................... 381/71.5

FOREIGN PATENT DOCUMENTS

JP 6062499 3/1994

* cited by examiner

*Primary Examiner*—Stella Woo
(74) *Attorney, Agent, or Firm*—Birch, Stewart, Kolasch & Birch, LLP

(57) ABSTRACT

A method and apparatus for attenuating acoustic reflections related to sound radiated by a loudspeaker in an acoustic space. According to the method, at least one cancelling loudspeaker is used for radiating a canceling sound in the space. The signal required for producing the cancelling sound is sampled from the sound reproduction apparatus prior to the processing of the original sound signal for emission into the acoustic space. The sample signal is low-pass filtered, delayed, amplified and inverted prior to being taken to the cancelling loudspeaker. The sound reproduction apparatus includes a signal sampling device, control devices, and at least one cancelling loudspeaker for radiating the cancelling sound.

20 Claims, 6 Drawing Sheets

SOUND REPRODUCTION EQUIPMENT AND METHOD FOR REDUCING THE LEVEL OF ACOUSTICAL REFLECTIONS IN A ROOM

CROSS REFERENCE TO RELATED APPLICATION

This application is the national phase under 35 U.S.C. §371 of PCT International Application No. PCT/FI99/00534 which has an International filing date of Jun. 17, 1999, which designated the United States of America.

BACKGROUND OF THE INVENTION

1. Field of the Invention

The invention relates to sound reproduction equipment and method for reducing the level of acoustical reflections in a room.

Methods concerned in the invention are used in conjunction with electrical systems intended for producing sound including sound reproduction equipment or electronic music instruments in order to attenuate acoustic reflections in a space into which the sound is being reproduced. Such a space may be, e.g., a room arranged for listening music or monitoring sound quality.

2. Description of the Related Art

In the prior art, undesired acoustic reflections and room resonances have been attenuated by generating such a cancelling sound wave that via the destructive interference of acoustic waves attenuates the unwanted sonic pressure wave components. The cancelling wave to an original sound wave is acoustic energy incident at the same frequency and at least essentially out-of-phase with the original sound wave. In turn, the amplitude of the cancelling wave determines the degree of sound attenuation. In order to achieve perfect cancellation of the original sound, the cancelling wave must have a frequency and amplitude exactly equal to those of the original sound and a phase exactly opposite to that of the original sound at a given spatial point. If the undesired sound is composed of a plurality of frequencies, the above-listed cancellation criteria must be fulfilled separately for each frequency component of the sound to be cancelled. This technique is described in U.S. Pat. No. 2,043,416, for instance.

When generating a cancelling sound wave, it is necessary to know the properties of the sound to be attenuated with a reasonable accuracy in order to produce the required cancelling sound signal in a proper manner. Conventionally, this is accomplished through, e.g., measuring the sound to be cancelled by a microphone, processing the measured signal in order to produce the required cancelling sound signal and converting the processed signal into a physical cancelling sound by a loudspeaker mounted at the desired point of cancellation. The placement of the microphone in respect to the loudspeaker in the direction of sound propagation has been dictated by the selected cancellation technique depending on whether the so-called feedforward or the so-called feedback method is used.

In the feedforward method, the microphone has been located in front of the loudspeaker in the direction of propagation of the sound to be cancelled, at a point permitting the microphone to measure the sound to be cancelled alone, without being responsive to the cancelling sound wave. The measured signal has been processed in respect to the signal delay in the sound cancellation equipment and the signal transfer function plus the acoustic propagation delay of the sound to be attenuated between the microphone and the loudspeaker radiating the cancelling sound wave. In a practicable system, there is further needed a second microphone located after the loudspeaker in the direction of the original sound propagation, whereby the signal of the second microphone is used for monitoring the efficiency of sound cancellation and for controlling the signal level to be fed to the loudspeaker. The feedforward-type generation of the cancelling sound wave is described in U.S. Pat. No. 4,122,303, for instance.

In the feedback method, the microphone is located after the loudspeaker in the direction of propagation of the sound to be cancelled, whereby the microphone is responsive to both the loudspeaker radiating the original sound and the loudspeaker radiating the cancelling sound wave. The goal herein generally is to minimize the amplitude of the signal measured by the microphone or at least to bring it down to a desired level. If also the microphone is located after the loudspeaker in the direction of propagation of the sound to be cancelled, the method must be capable of predicting the level of the signal to be attenuated on the basis of the measured interference signal. To attain a good attenuation efficiency, a number of different methods of processing the measured signal have been developed. A more detailed description of the cancellation signal processing technique can be found in U.S. Pat. No. 4,878,188, for instance. The prior art also includes cancellation sound generation techniques based on combinations of feedforward and feedback methods.

In U.S. Pat. No. 4,899,387 is further disclosed an apparatus for cancelling low-frequency acoustic resonances in a room used as an acoustic space. The apparatus is particularly suited for improving room acoustics in listening to music. The major single factor causing acoustic frequency response variations typically is the listening room itself that may readily cause deviations as large as 20 dB at some frequency in the amplitude response in a given point of the listening room. These deviations are caused by the interference of sonic pressure waves reflecting from the walls of the listening room with pressure waves radiated directly from the loudspeakers. Obviously, the need for improved listening room acoustics is urgent.

The embodiment described in cited U.S. Pat. No. 4,899,387 attempts to solve the above-described problem by placing cancellation apparatus units in the room at the pressure maxima or in the immediate vicinity thereof. Said cancellation apparatuses comprise a microphone for sensing the sound pressure waves and signal processing means and a cancelling loudspeaker for producing the cancelling pressure waves to the reflected original sound thus measured. In this arrangement, the microphone is located close to the cancelling loudspeaker, and with the help of a feedback circuit, the goal is to alter the acoustic impedance of the cancelling loudspeaker such that the effect of the room acoustics on the smoothness of the sound field is eliminated. This technique bears the risk of instability of the feedback loop that also includes the sound cancellation apparatus itself, whereby the system may start to oscillate.

In Pat. Appl. No. JP 6-62499 is disclosed another system for eliminating reflected pressure waves. Differently from those described above, this arrangement uses no microphones placed in the listening room, but rather the signal is sampled directly from the stereophonic audio system used for producing the original audio signal. The system disclosed in cited publication JP 6-62499 comprises cancelling loudspeakers placed in the listening room and a cancellation signal generator adapted to feed said loudspeakers. The cancellation signal generator itself includes delay and amplitude control circuits for delaying the signals of the left and right audio channels and for setting the signal amplitudes separately for each cancelling loudspeaker. The cancellation signal generator further includes summer circuits for combining the signals processed in the delay and amplitude control circuits into output signals to be taken to each of the cancelling loudspeakers and inverter circuits for inverting the phase of each combined signal. The delay circuits are controlled to delay each signal individually by the time of sound propagation from the original sound loudspeaker to the cancelling loudspeaker. E.g., in a system of four cancelling loudspeakers, the signals for each loudspeaker are formed from the signals of both the left and the right channel with appropriate delays. Additionally, also the signals of the loudspeakers and/or cancelling loudspeakers reflected from the walls can be taken into account, whereby a different delay and gain must be set for each signal separately.

A problem in the apparatus of cited publication JP 6-62499 is that, in spite of the extremely complicated technique of cancellation signal generation, the system is incapable of eliminating all the reflections occurring in the listening room and particularly not the diffraction waves caused by obstacles in the listening room. It must also be noted that the point-source type cancellation sound radiators used according to the publication even theoretically can eliminate reflected pressure waves but only in very singular points of the listening room. Other points of the room remain void of any attenuation, but rather the apparatus brings about a greater level of distortion and unwanted fields of reflected sound in the listening room. At some locations of the listening room, the original sound and the cancelling pressure wave are even in phase, whereby interference wave thus formed amplifies the reflection wave almost two-fold in amplitude in regard to the initial reflection already when using one cancellation signal.

BRIEF SUMMARY OF THE INVENTION

It is an object of the present invention to provide an entirely novel method that in a simple manner is capable of reducing the disturbing low-frequency acoustic reflections otherwise occurring in a listening room without the disadvantage of simultaneously creating new disturbance at higher frequencies. It is another object of the invention to provide a sound reproduction apparatus offering attenuation of annoying reflected sound in a listening room with a simpler construction and improved performance over that available in conventional apparatuses.

The goal of the invention is achieved by way of sampling the sound signal electrically from the equipment used for producing the original sound such as the amplifier feeding a loudspeaker. The sample signal is processed in order to generate the cancellation signal for attenuating the pressure level of reflections and the cancellation signal thus formed is converted by means of at least one loudspeaker into a cancelling sound in the listening room where the impact of reflections is desired to be attenuated. According to the invention, the sample signal used for generating the cancellation signal is filtered so as to free the signal from essentially all the sound components that can create a so-called diffuse sound field in the listening room. The term diffuse sound field refers to a situation in which the sound does not excite a pressure pattern of systematic reflections in the listening room, but rather the sound field is comprised of an incoherent composite waves formed by reflections from a plurality of different surfaces and/or diffraction waves about different objects. In such a diffuse sound field, each point of the listening room receives waves related to the same original sound but received as a sum of partial waves in different phase and incoherently directed, which makes the behaviour of the interfering wave pattern difficult to predict. The filtration is advantageously performed before the delaying operation and the setting of the signal phase and amplitude. According to the invention, per each cancellation signal feeding the respective cancellation sound radiator is set a single optimized delay that minimizes the disturbing resonance in the room. However, differently from the approach of cited publication JP 6-62499, the suitable delay is not determined directly from the times of propagation of the acoustic signals by computational means, but instead, the delays required in a specific acoustic system are optimized by on-site tests. Also the level of the cancellation signal is advantageously determined on the basis of measurements performed on the attenuation results in the listening room, and the goal is to set the level of the cancellation signal to such a value that achieves the desired change in the acoustic pressure wave pattern of the room at the frequencies to be attenuated without causing an excessive attenuation to the original acoustic signal. Thus, the object of the invention does not include a complete elimination of the undesired pressure waves to be attenuated at the points of controlled cancellation.

The invention offers significant benefits.

As the sample signal is taken in electrical form from the sound-producing system, the method or apparatus according to the invention disposes of the need for any microphones in its operation. Resultingly, the construction of the sound reproduction apparatus may be simplified and it can operate without being dependent on such external factors as any possible changes in the response of a monitoring microphone caused by aging or heating, for instance. Furthermore, since the cancelling sound is produced according to the invention only at low frequencies, the application of the invention does not introduce any superfluous high-frequency signals of disturbing nature in the listening room.

As compared to methods and apparatuses of the feedback type, a further benefit of the invention is the sound-reproduction apparatus according to the invention has no electroacoustic feedback circuit, whereby it involves no risk of an unstable state of oscillation.

A further benefit resulting from low-pass filtration prior to taking the signal to the delay circuit is that the information content of the signal to be delayed is reduced and the delay can be accomplished by means of a relatively simple digital circuit. Hence, the invention makes it possible to manufacture a simple apparatus at a low cost for improving the acoustics of a listening room.

A still further benefit of the invention is that the low-frequency spectrum of the cancelling sound allows the arrangement according to the invention to be implemented using only one delay circuit per each cancellation sound radiator. Hence, it is also unnecessary to define separately the delays for the left and right channels in a stereophonic system. Broadly, even a multichannel sound reproduction system can manage in a similar manner with only one delay circuit per each cancellation sound radiator.

A still further benefit of the invention is that when the volume of the cancelling sound is set appropriately below the level of the original sound, the level of the low-frequency bass sound whose reflections are to be attenuated can be retained unchanged in the acoustic space, which is contrary to the behaviour of conventional techniques in which the goal is to produce a cancelling sound capable of completely nulling the unwanted frequency component of the original sound field.

When the delay and gain of the cancellation signal to be launched in the listening room is set in a proper ratio to the sound emitted by original signal sources, the invention can by the above-described means achieve a consistent cancellation result irrespective of changes made in the acoustic environment of the listening room. As the apparatus needs no sound-sensing microphone during sound reproduction, there is no risk of having function of the apparatus according to the invention affected by vibration or other disturbance normally imposed on a microphone in a sonic field.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and of the scope of the invention will become apparent to those skilled in the art from this detailed description.

BRIEF DESCRIPTION OF THE DRAWINGS

In the following, the invention will be examined in greater detail with the help of exemplifying embodiments by making reference to the appended drawings, in which.

DETAILED DESCRIPTION OF THE INVENTION

In the text of the present application, the term microphone is used in making reference to any device capable of converting an acoustic signal into an electrical signal so that the information carried by the acoustic pressure wave including the frequency and amplitude information thereof can be transferred at least by its essential parts over to the electrical signal. Respectively, the term loudspeaker is used in making reference to a device capable of signal conversion in the opposite direction.

The term sound reproduction path is used when making reference to the path of the original sound signal in the sound reproduction apparatus from the sound signal source via the amplifiers and other required units to the loudspeaker in which the signal to be reproduced is converted into a sound suitable for emission into the acoustic space. The term sound signal source as used in the present text can refer to any device capable of feeding the signal to be reproduced into the sound reproduction apparatus by virtue of, e.g., converting information stored in a storage means such as a magnetic tape or optical disc into a format compatible with the input of said sound reproduction, apparatus. Hence, the sound signal source can be a radio receiver, for instance. Respectively, the term cancellation sound signal path in the present text is used when making reference to a signal path in the sound reproduction apparatus from the sound signal source via the required units for processing the cancelling sound up to a cancelling loudspeaker in which the cancellation signal to be reproduced is converted into a pressure wave for emission into the acoustic space as a cancelling sound that attenuates a reflected pressure wave.

The sound reproduction apparatus may include a plurality of sound reproduction paths, cancellation sound signal paths and/or sound signal sources. Furthermore, the paths of the original sound signal and the cancellation sound signal may also partially overlap in the sound reproduction apparatus.

The term signal separation means is used when making reference to a device suited for separating at least one given frequency band from a broadband signal spectrum. Such separating means include, e.g., low-pass and band-pass filters.

Figure 1:
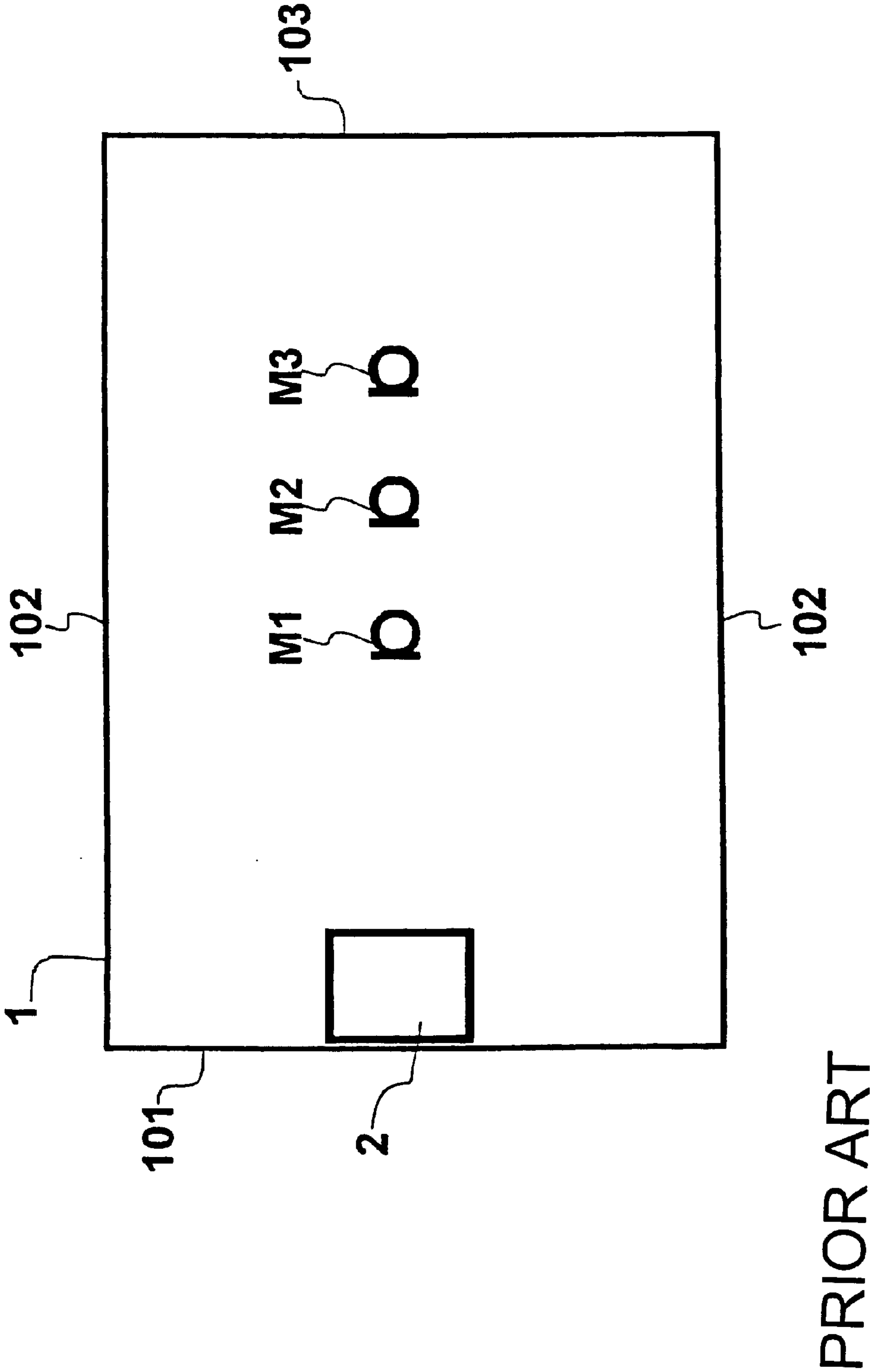
PRIOR ART Fig. 1
FIG. 1 shows a prior-art acoustic arrangement with three control sensing points.
Figure 2:
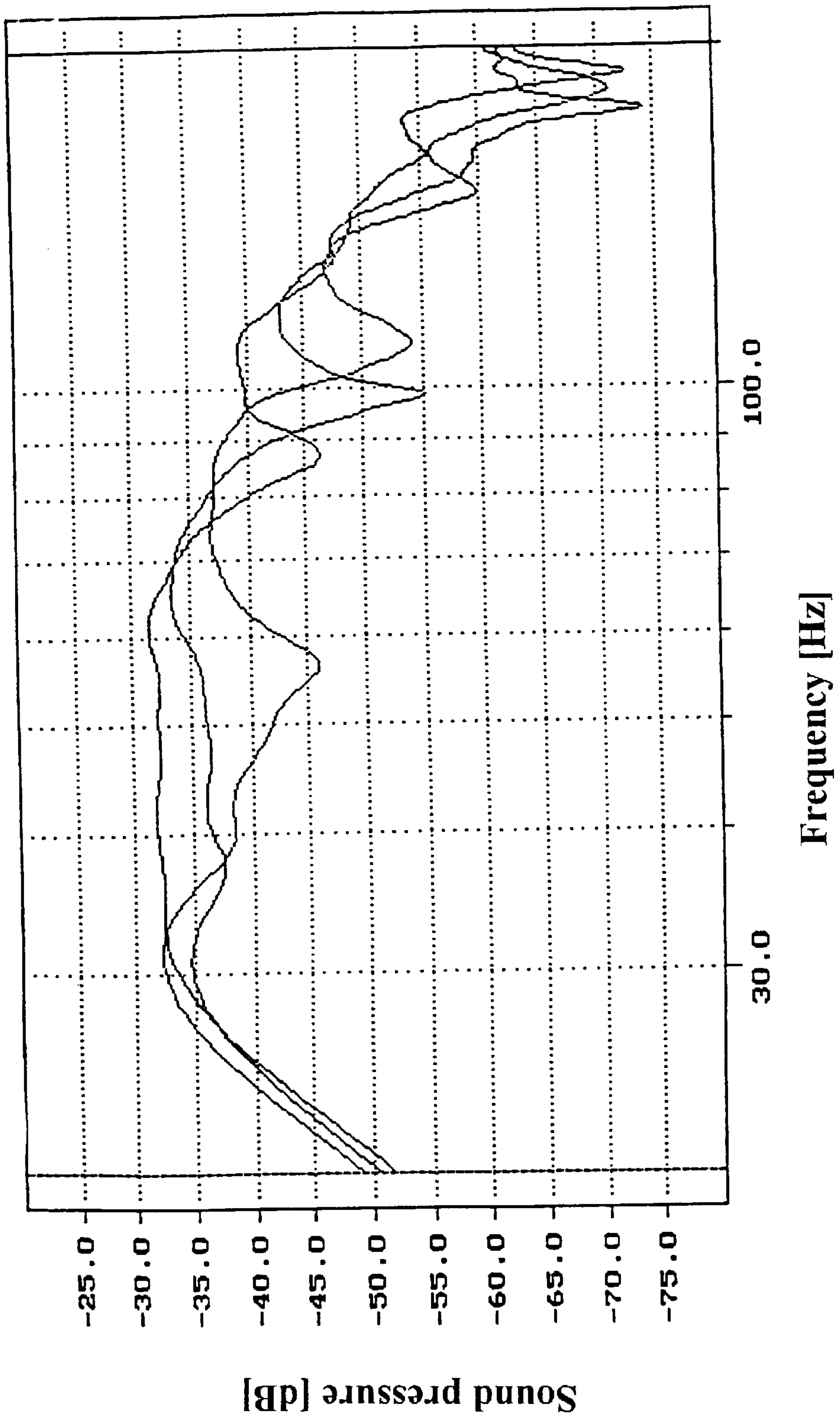
PRIOR ART Fig. 2
FIG. 2 shows typical spectral response curves at the lower frequency range in the acoustic arrangement of FIG. 1.

In the embodiment shown in FIG. 1, there is located a loudspeaker 2 close to the front wall 101 of a room 1. The loudspeaker 2 can be, e.g., a subwoofer connected to a stereophonic or multichannel sound reproduction apparatus suited for emitting low-frequency sounds. When an acoustic signal containing low-frequency sounds is radiated into the room 1 by the loudspeaker 2, reflections of the propagating pressure waves occur. In the case that the duration of the sound radiated by the loudspeaker lasts sufficiently long, a sound field of acoustic resonance may build up in the room 1. Reflections are chiefly built up between the pairs of planar walls formed by the front wall 101 and the rear wall 103, the opposite side walls 102 and the ceiling and floor of the room. In FIG. 2 are plotted the frequency responses measured at locations M1, M2 and M3 of the room 1 illustrated in FIG. 1.

As can be seen from the curves of FIG. 2, room reflections affect the sound quality in a drastic manner in situations described above. This is particularly annoying in the acoustic monitoring rooms of sound-recording studios in which the reflections can cause significant local deviations in the frequency spectrum of the sound pattern heard by the listener. As a consequence, errors may be introduced into the stored format of recordings.

Figure 3:
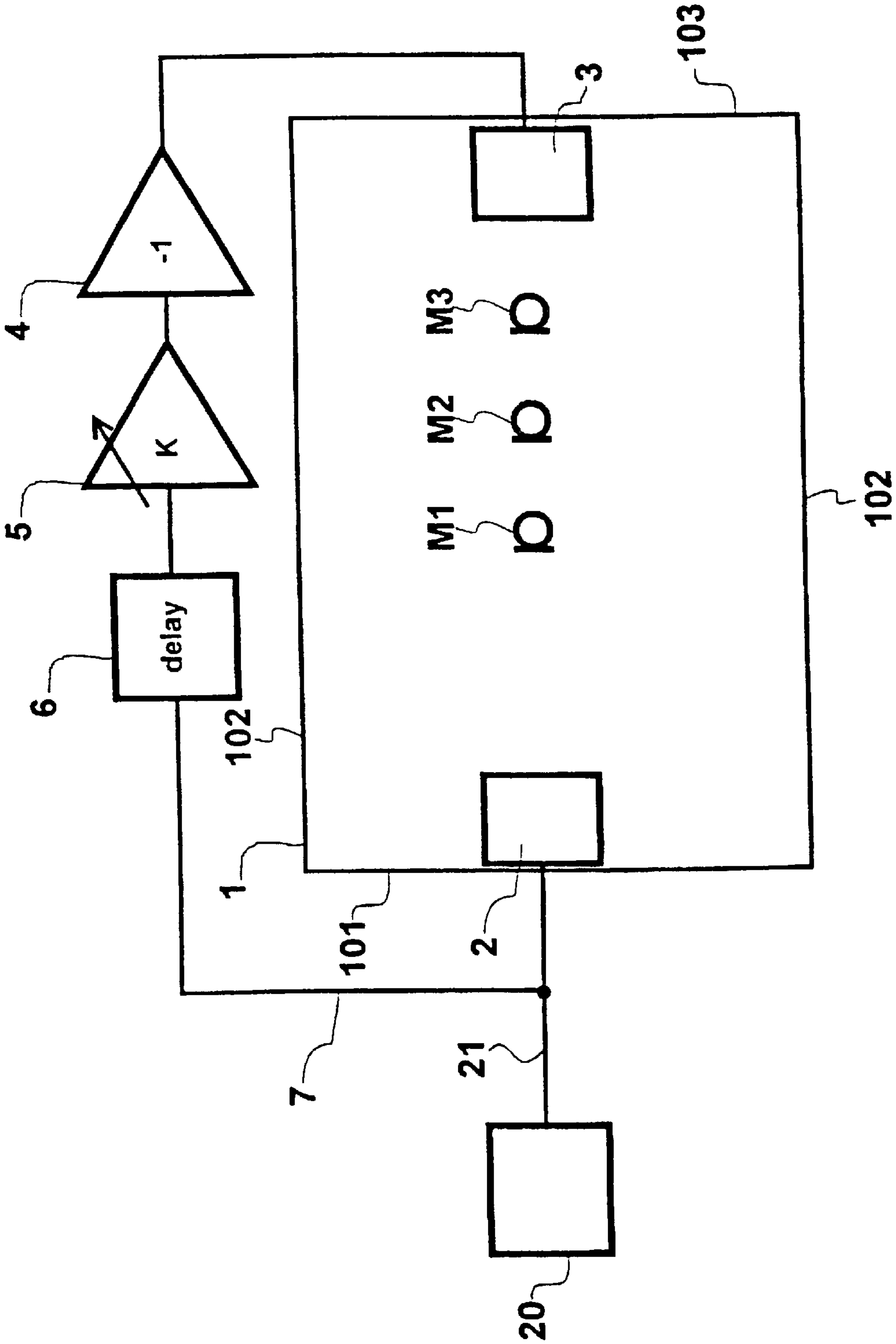
FIG. 3 shows schematically an acoustic arrangement according to the invention with three control sensing points.

In FIG. 3 is shown one of the simplest embodiments of the invention. In this embodiment, the goal is set to merely attenuate longitudinal reflections in the listening room 1. In the arrangement, there is placed close to the front wall 101 of the listening room 1 a loudspeaker 2 serving to radiate sound into the space of the listening room. The loudspeaker 2 is driven via conductors 21 by an amplifier 20. While the amplifier 20 and the conductors 21 for the sake of greater clarity in are drawn in the diagram of FIG. 3 so as to be located outside the room 1, these components in plurality of practical arrangements are located in the interior of the listening room 1. Respectively, the sound cancellation apparatus of room reflections comprises a cancelling loudspeaker 3 located in the vicinity of the rear wall 103 of the listening room 1, control means 4, 5, 6 connected to said cancelling loudspeaker 3 so as to process the required cancellation sound signal and drive said cancelling loudspeaker 3, and sampling means 7 connected to said control means 4, 5, 6 for sampling the electrical signal taken to said loudspeaker 2.

The sampling means 7 comprise an electrical circuit. The signal sample is taken from the signal driving the loudspeaker 2, whereby the sampling means 7 are connected, e.g., over the input conductors 21 of the loudspeaker 2 or over the output terminals of the amplifier 20 driving said conductors 21. If the signal is to be passed to the loudspeaker 2 already filtered into frequency bands, the signal is sampled from the circuit driving the low-frequency bass sound reproduction circuit. In the case that the signal may also contain higher frequency components, the apparatus is complemented with a low-pass filter advantageously connected between said sampling means 7 and said control means 4, 5, 6. By contrast, an embodiment having the signal passed to said loudspeaker(s) 2 already divided into frequency bands obviously includes an inherent low-pass filtration, whereby a separate low-pass filter is redundant provided that the filter cutoff frequencies of the bands are properly matched. The low-pass filter or a band-splitting device implementing the equivalent function is adapted to admit via the cancellation signal path only such signal components that are so low as to be essentially capable of invoking systematic reflections at said frequencies in the listening room 1. In practice, this condition appears at frequencies having a wavelength at least essentially approximating the dimensions of the listening room. The low-pass filter upper cutoff frequency is set, e.g., at 200 Hz, which corresponds to the wave length of 1.5 meters. At shorter wavelengths the obstacles of the room begin to cause substantial diffraction, whereby the reflections loose their systematic nature. In this fashion, the signal to be taken to the control means 4, 5, 6 is filtered free from frequencies causing a diffuse sound field.

A particularly advantageous application of the invention is found in the attenuation of the disturbing resonance invoked by the subwoofer radiator of low-frequency bass sounds in a listening room. Herein, the sample signal is taken from the signal driving subwoofer radiator emitting the low-frequency bass sounds of the original signal, and the cancelling sound is emitted by means of, e.g., another similar subwoofer radiator placed on the opposite side of the listening room.

In conjunction with stereophonic or multichannel sound reproduction, it must be noted that the sample signal is taken from each active channel separately. The sample signals taken from each channel are subsequently combined into a single sample signal which is passed along the cancellation signal path forward toward the control means 4, 5, 6. The combination of the signals of the different channels may also be performed in the sound reproduction signal path, e.g., in conjunction with the generation of the original subwoofer signal, whereby the sample signal is advantageously obtained from this sum channel signal without any separate summing operation. Owing to the summing of the cancellation signal from the separate channels, the control means 4, 5, 6 can be simplified significantly over those disclosed, e.g., in cited patent publication JP 6-62499.

The control means 4, 5, 6 comprise in series a delay circuit 6, a gain-controlled amplifier 5 and an inverter 4. The delay circuit 6 must be capable of providing a controllable delay approximately equal to the acoustic delay between the original sound loudspeaker 2 and the cancelling loudspeaker 3. As the acoustic delays encountered in conventional listening rooms may be in the order of 40 ms typical, the delay circuit 6 is advantageously implemented using digital techniques. The final value of required delay is sought by tests, whereby the specific characteristics of the acoustic system will be automatically taken into account.

In the exemplifying embodiment, the digital delay circuit 6 includes an AD converter for processing the sample signal into digital format, memory circuits for storing the digital sample signal, a DA converter for converting the sample signal back into analog form and a microcontroller for connecting the digital sample signal from the AD converter to the memory circuits as well as, after the lapse of the delay time, out from the memory circuits to the DA converter. The delay circuit 6 also includes a number of operational amplifiers. As the invention operates with low-frequency signals, the system can be implemented without necessarily using expensive components. In fact, operation at audio frequencies below 200 Hz can be managed using a signal sampling rate as low as 1 kHz in the delay circuit 6. The delay itself can be implemented using, e.g., 40 memory locations, each of which storing the sound pressure information in 16-bit digital format. The AD and DA converters may respectively be of an 18-bit type. Additionally, each delay circuit needs a low-cost microcontroller.

In the above-described system, the delay can be set with an accuracy of 1 ms and the resolution of the sound pressure control is determined by the 16-bit storage. When a higher accuracy of delay setting is desired, a higher sampling rate can be used in combination with a larger number of memory locations. The required number of memory locations is thus determined as a product of the desired maximum delay time with the sampling rate. For a longer delay, a greater number of memory locations is obviously needed. Respectively, the resolution of sound pressure control can be improved by using a longer word length for the signal sample. The physical construction of the control means 4, 5, 6 can be placed, e.g., in the interior of the enclosure of the cancelling loudspeaker 3.

If the original sound loudspeaker 2 and the cancelling loudspeaker 3 have different phase response characteristics, which also means different delays, the compensation of the delay differences may be accomplished by applying a frequency-dependent delay to the audio signal in the apparatus which processes the cancelling sound. Herein, the filter implementing the frequency-dependent delay can be realized using, e.g., a digital signal processor. In contrast, if the loudspeaker 2 and the cancelling loudspeaker 3 have identical phase response characteristics and their location in the listening room is sufficiently symmetrical in regard to the sound reflections, only a controlled delay is required, and the digital signal processor can be replaced by an extremely cost-effective microcontroller.

Figure 6:
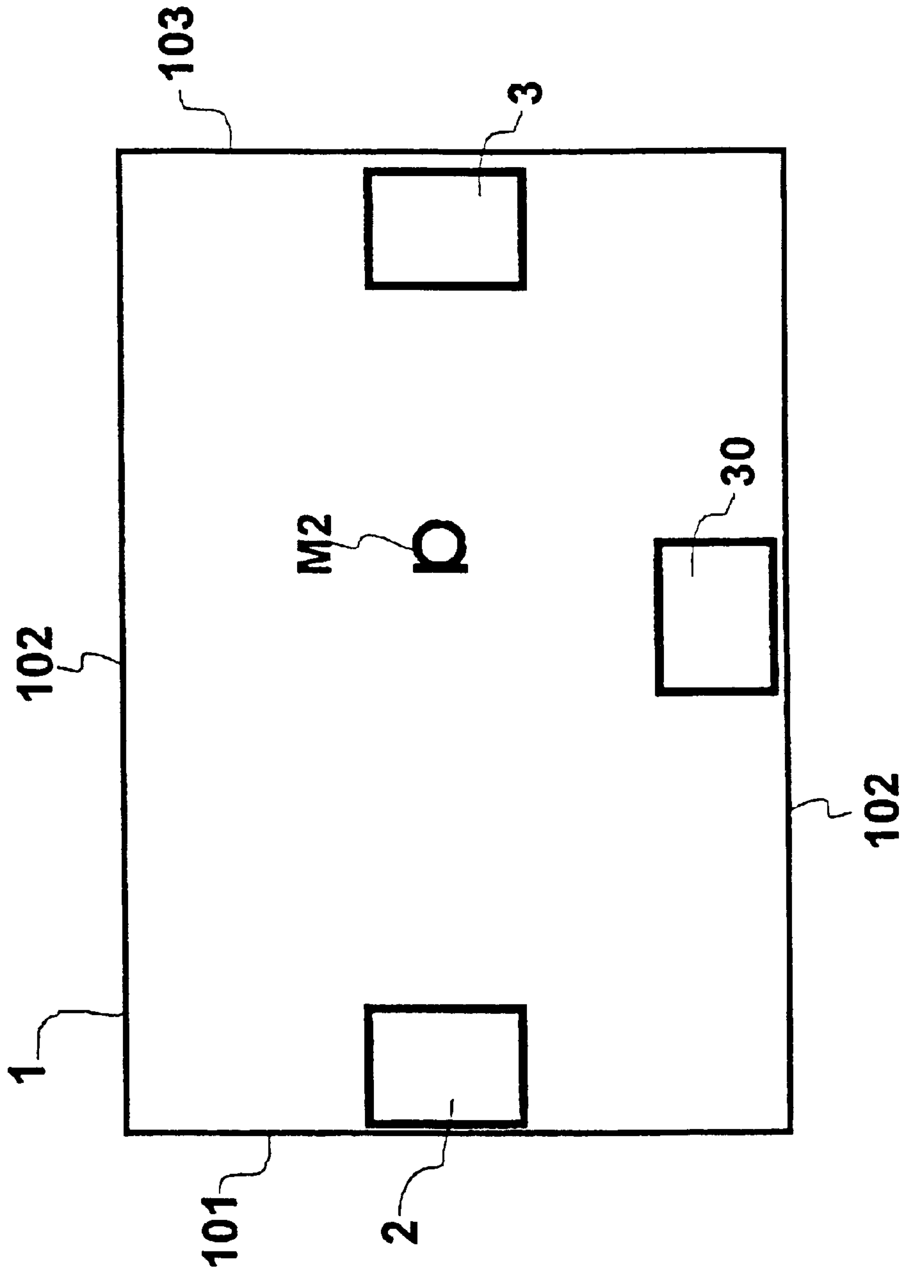
FIG. 6 shows schematically a second embodiment of acoustic arrangement according to the invention with one control sensing point.

The cancelling loudspeaker 3 is advantageously located at the resonant pressure maximum of the standing wave. In practice this typically means that the advantageous location of the cancelling loudspeaker 3 or loudspeakers 3 is close to that reflecting wall whose reflection to impinging sound is desiredly attenuated. Herein, the cancelling loudspeaker 3 can be considered to modify the acoustic impedance of the reflecting wall. If the number of the cancelling loudspeakers 3 is one, the single loudspeaker is advantageously placed close to the wall surface opposite to the original sound loudspeaker 2 or loudspeakers 2. In the case that a greater number of cancelling loudspeakers 3 are used, they can be placed in a distributed manner, e.g., on the wall facing the loudspeakers 2. Alternatively, the cancelling loudspeakers 3, 30 can be distributed as shown in FIG. 6 so that the transverse standing waves excited between the side walls 102 of the acoustic space are attenuated by means of one cancelling loudspeaker 30 placed close to one of the side walls 102 and the longitudinal standing waves are attenuated by means of another cancelling loudspeaker 3 placed close to the rear wall 103. If the cancelling loudspeakers 3, 30 are located far apart from each other in the acoustic space, the cancellation sound signals for the cancelling loudspeakers 3, 30 are generated and amplified separately so that their delay and gain are adjusted individually for each cancelling loudspeaker 3, 30. Further, if the system is configured with adjacently placed cancelling loudspeakers 3, 30, all of them can be driven with the same cancellation signal. In this kind of system, the adjacent cancelling loudspeakers as an entity can be considered to form a single cancelling loudspeaker 3, 30. The mutual displacement between the cancelling loudspeaker units is measured against the wavelengths being attenuated.

The response of the cancelling loudspeaker 3, 30 at low frequencies is advantageously made identical to that of the original sound loudspeaker 2. The easiest way of fulfilling this need is to make the construction of the cancelling loudspeaker 3, 30 identical to that of the loudspeaker 2 at the frequency range of reflections to be attenuated. An advantage gained from identical response characteristics of loudspeakers is that the control means 4, 5, 6 in this type of system do not need to perform compensation of loudspeaker response differences in order to attain a good attenuation result. Hence, the control means 4, 5, 6 can be implemented in the manner described above, and the entire system has a simple structure. As the cancelling loudspeaker 3, 30 serves in the system to radiate low-frequency sounds alone, it is often advantageous to construct a cancelling loudspeaker 3, 30 at a lower cost than that of the original sound loudspeaker 2, whereby its characteristics need to be identical to those of the loudspeaker 2 only at low frequencies. Resultingly, the cancelling loudspeaker 3, 30 need not have any response characteristics in the mid- and high-frequency ranges. Obviously, these mid/high-frequency components must then be filtered in the above-described manner away from the signal to be taken to the cancelling loudspeaker 3, 30.

Figure 5:
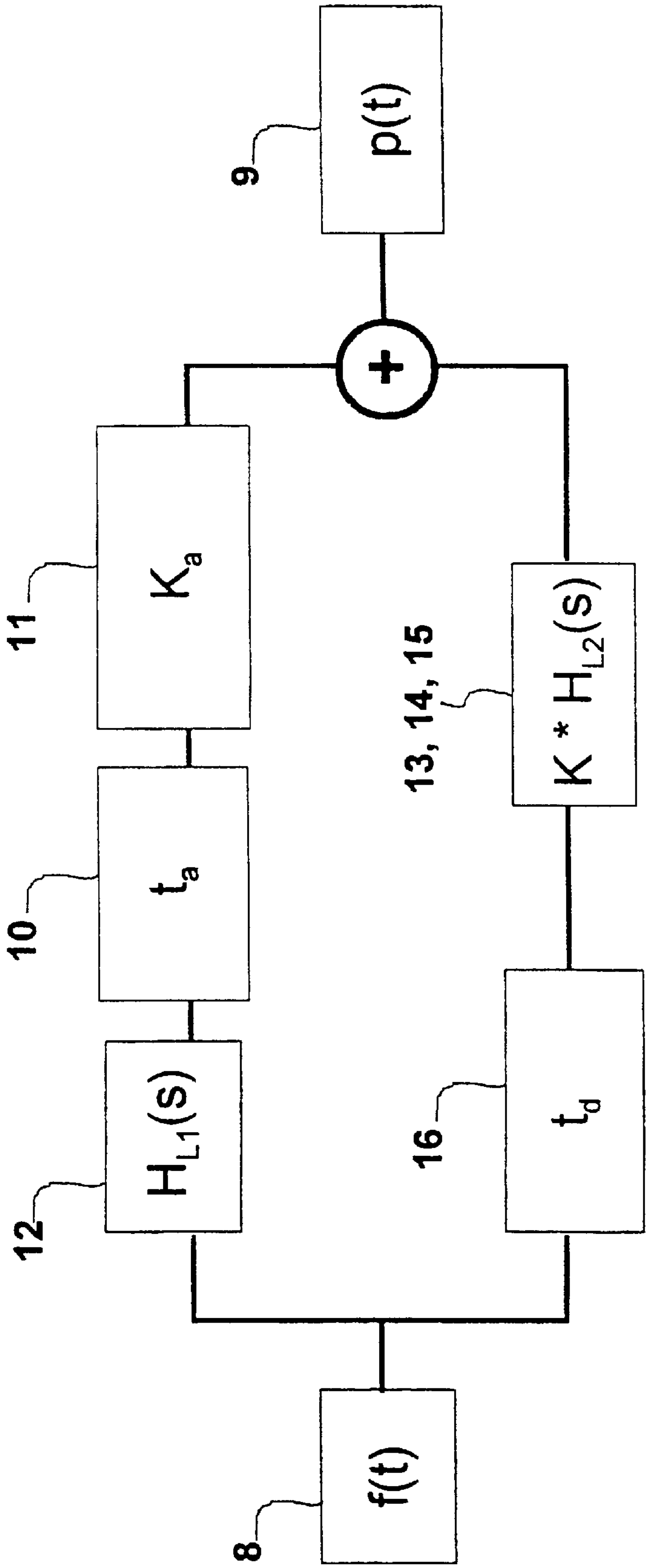
FIG. 5 shows a block diagram of signal paths in the acoustic arrangement of FIG. 3.

In FIG. 5 is schematically shown the signal flow diagram of the acoustic system illustrated in FIG. 3. As shown in FIG. 5, the signal leaves the sound signal source 8 by branching into two paths which are taken to the rear wall 103 of the acoustic space, where the radiated sound signals sum to form a sound pressure 9 at the rear wall 103. The acoustic signal path comprises the transfer function 12 of the original sound loudspeaker 2 as well as the acoustic delay 10 and attenuation 11 of the sound radiated by the loudspeaker 2 as the sound propagates through the room 1 to the rear wall 103 thereof. The electrical signal path comprises the delay 16 generated by the delay circuit 6 as well as the transfer function 13, 14, 15 including the gain 15 of the control amplifier 5, the inverter circuit 14 and the transfer function of the cancelling loudspeaker 3. In the essential vicinity of the rear wall 103, the sonic signals emitted over the two signal paths are in the form of a pressure wave and the sum of these pressure waves form the sound pressure 9 at the rear wall 103. In a reflection-free situation, the sound pressure 9 at the rear wall 103 is equal to that received at an attenuated sound pressure from a point source radiating at a given distance from the wall. The sound pressure is then inversely proportional to the square of the distance from the source to the point of measurement (also known as the 1/R wave propagation law). Hence, the goal is to design the electrical signal path such that with a reasonable accuracy at the location of the cancelling loudspeaker 3 can radiate a sonic signal whose sum with the acoustic signal radiated by the loudspeaker 2 and the reflections thereof fulfills the above-described inverse attenuation law. Accordingly, the present invention is different from the prior art therein that the attempt is not to null all pressure waves entirely at the cancelling loudspeaker 3, but rather, the spirit of the invention is to produce a suitable sound level into the listening room so that the distortion in the sound field caused by the reflections of low-frequency bass sounds are cancelled, however, without nulling the low-frequency components of the original sound.

In a system having a plurality of cancelling loudspeakers 3, 30, the above-described inverse law of sound propagation must be fulfilled separately for each cancelling loudspeaker 3, 30. In the placement of the cancelling loudspeakers 3, 30 at any location other than the wall opposite to the original sound loudspeaker 2, particular attention must be paid to the essential impact of the reflections in the listening room 1 on the design of the transfer function 14, 15 and delay 16 of the control means 4, 5, 6 driving the cancelling loudspeaker 3, 30. Especially for embodiments using a plurality of cancelling loudspeakers 3, 30, the settings of the acoustic system must be verified by measurements. Also in a system having only one cancelling loudspeaker 3, it is advantageous to test the settings by measurements at least when an exceptionally high sound reproduction performance is desired. It must be further noted that the pressure wave patterns of reflected sound in the listening room is affected by the placement of the cancelling loudspeakers 3 in a mutually interacting manner, whereby the tuning of a system comprising multiple cancelling loudspeakers must be performed as a sequence of iterative steps.

Figure 4:
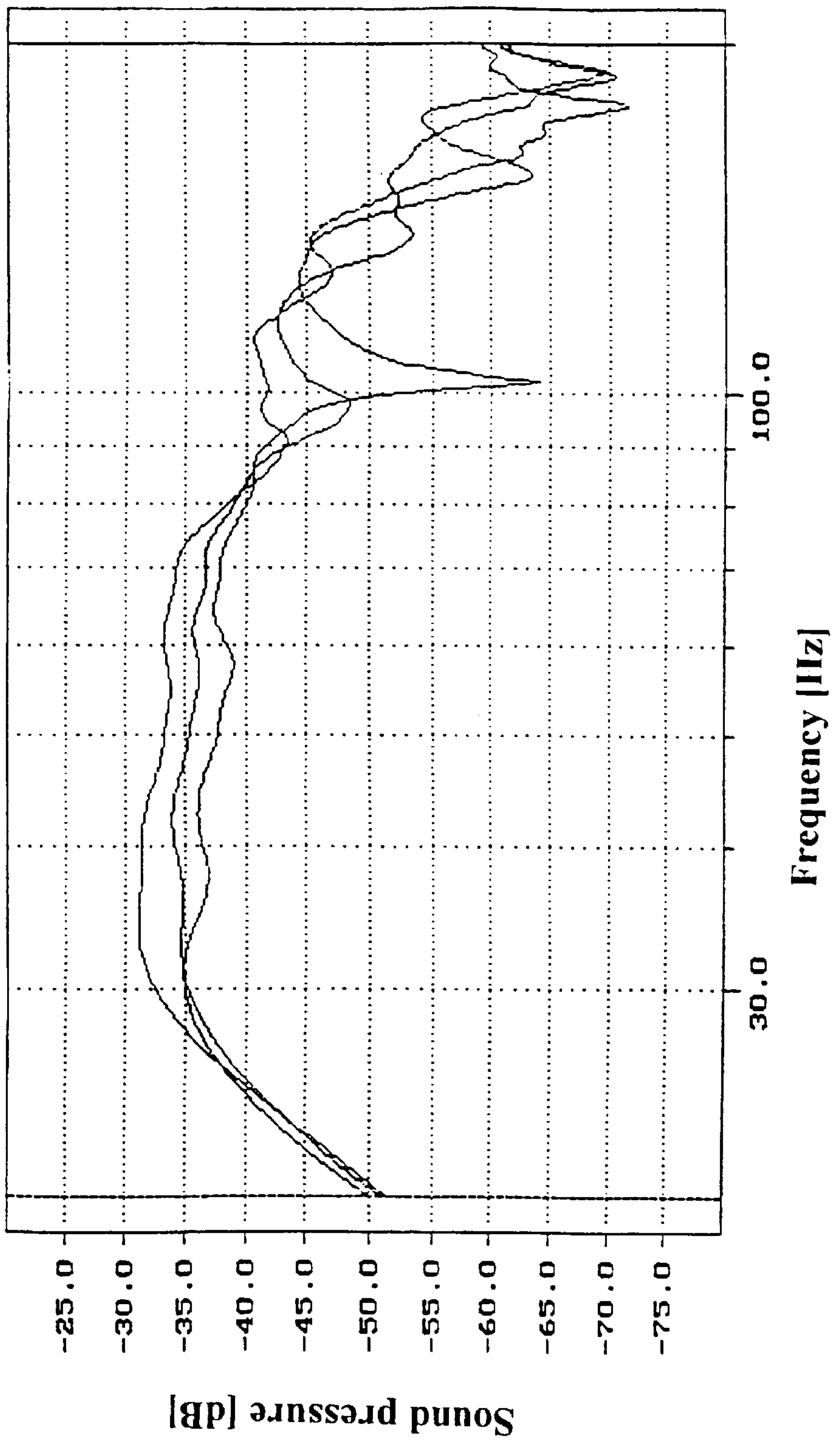
FIG. 4 shows spectral response curves at the lower frequency range in the acoustic arrangement of FIG. 3.

In FIG. 4 are plotted the frequency responses measured at locations M1, M2 and M3 in a corresponding manner to those shown in FIG. 2, now having a cancelling loudspeaker 3 placed near the rear wall 103 of the room 1. As is evident from FIG. 4, the reduced pressure wave of the rear-wall reflection has brought the frequency responses at the measurement microphone locations closer to the 1/R propagation law of the sound pressure emitted by a point-source type radiator according to which the sound pressure falls inversely to the distance from the radiator. Also the resonant behaviour of the room 1 has been reduced over the controlled frequency range. To obtain a good 1/R behaviour of the frequency response curve of the system, the output level of the cancelling loudspeaker 3, 30 in the vicinity of the reflecting wall and the cancelling loudspeaker 3, 30 should be set depending on the type of reflecting wall to, e.g., about 4–6 dB below that of the original sound loudspeaker 2. Hence, the cancelling loudspeaker 3, 30 in typical installations need not have as high a sound output capability as the original sound loudspeakers 2.

In addition to those described above, the invention may have alternative embodiments as shown in FIG. 6.

If both the original sound loudspeaker 2 and the cancelling loudspeaker 3, 30 behave essentially as point-source radiators, the sound field excited by them create deviations in the interference sound wave at locations falling outside the centerline drawn between the loudspeakers. The deviations get larger at higher frequencies. One technique serving to even out the deviations to some extent is the use of multiple cancellation sound sources 2, 3, 30 instead of only one source 2, 3, 30. Thus, the invention may be extended by the combination of a plurality of point-source radiators 2, 3, 30 to the control of reflections in larger spaces and, in a reduced scale, also at higher frequencies. Analogously on this line, the invention may also be applied when planar radiators such as large-area loudspeakers are used in the sound reproduction system.

Furthermore, the scope and spirit of the invention does not limit the number of cancelling loudspeakers 3, 30 used in the system. Hence, the cancelling loudspeakers 3, 30 can be located so that, e.g., the rear wall 103, both side walls 102 and the ceiling are each of them equipped with separate cancelling loudspeakers 3, 30. If the loudspeakers 2 have such an omnidirectionally radiating planar element in which the forward and rearward emitted sound waves are 180° out-of-phase with each other, it may be advantageous to have the cancelling loudspeakers 3, 30 also placed on the front wall 101 of the acoustic space so that they are located beside the loudspeakers 2.

The invention may also be used in conjunction with such sound reproduction systems in which the original sound signal is taken to the loudspeaker 2 in analog format using other transmission media than electrical conductors. Such a transmission path may be arranged using infrared radiation, radio waves or an optical fiber. Obviously, the transmission format need not necessarily be an analog signal. Instead, the transmission can be carried out using, e.g., an electrical signal of digital format. In these arrangements, the loudspeaker 2 may be an active loudspeaker having an integral amplifier. If the signal is transmitted in digital format, the sampling means 7 can admit the signal sample in digital format, whereby the delay circuit 6 needs no AD converter. The amplifier used in the signal processing unit may also include the required inverter stage.

The invention being thus described, it will be obvious that the same may be varied in many ways. Such variations are not to be regarded as a departure from the spirit and scope for the invention, and all such modifications as would be obvious to one skilled in the art are intended to be included within the scope of the following claims.

What is claimed is:

1. A method for attenuating the reflections of the sound pressure wave radiated by a sound reproduction apparatus into an acoustic space, said method comprising the steps of:

taking a sample signal from a signal intended for reproduction of the original sound, in the sound reproduction apparatus reproducing the original sound, processing the sample signal to set its properties including the delay, phase inversion and amplitude, passing the processed sample signal to a cancelling loudspeaker, and converting the processed sample signal by means of said cancelling loudspeaker into a cancelling sound radiated into said acoustic space for attenuating reflections of said original sound, wherein blocking essentially entirely the signal components having a sufficiently high frequency to create a diffuse sound field in said acoustic space during the reproduction of said signal components, from being passed for reproduction by said cancelling loudspeaker, and setting the volume of the cancelling sound below the level of an original sound.

2. The method according to claim 1, wherein said step of blocking undesired sound components from being passed to said cancelling loudspeaker is essentially entirely effected on cancellation signal components having a frequency greater than 200 Hz.

3. The method according to claim 1 or 2, wherein said sample signal is low-pass filtered in order to clean said sample signal free from said frequency components capable of forming a diffuse sound field.

4. The method according to claim 1 or 2, wherein said blocking of said diffuse-sound-field forming frequency components from passing to said cancelling loudspeaker is effected by taking the sample signal from the bass channel signal of the sound reproduction apparatus, which bass channel signal consists essentially of low-frequency signal components whose emission into said acoustic space causes essentially ordered reflections.

5. The method according to claim 1, wherein said cancelling sound is radiated at least at one reflection location of the original sound.

6. The method according to claim 1, wherein the amplitude of said cancelling sound is set essentially equal to the amplitude of said reflected wave of said original sound, whereby the change caused by the reflected wave in the sound field can be attenuated without cancelling the low-frequency components of the original sound.

7. The method according to claim 1, wherein the amplitude of said cancelling sound is set so that the acoustic output level of the cancelling sound in the vicinity of said cancelling loudspeaker is from 4 dB to 6 dB below the acoustic output level of the original sound.

8. The method according to claim 1, wherein the processing of the sample signal for setting the desired delay comprises the steps of producing said cancelling sound signal with a plurality of different delays, observing the degree of attenuation of acoustic reflections as a function of varying delay, and based on the observation results selecting a suitable delay that is different from the time of propagation of sound waves from the original sound loudspeaker to the location of the cancelling loudspeaker.

9. The method according to claim 1, wherein the loudspeaker used as said cancelling loudspeaker is of a type adapted to radiate low-frequency sounds only, such as one known as a subwoofer.

10. The method according to claim 1 for use in conjunction with a stereophonic or multichannel sound reproduction system, wherein the multichannel signal is combined into a single sample signal for said setting of cancellation signal delay, phase inversion and amplitude and passing to said cancelling loudspeaker.

11. A sound reproduction apparatus comprising:

a signal source serving to provide a reproducible original sound signal in electrical form from a sound recording, a sound reproduction signal path connected to said original sound signal source for passing said signal to be reproduced, said signal path including an amplifier for amplification of said signal to be reproduced, at least one loudspeaker connected after said amplifier on the sound reproduction path thus facilitating the conversion of said signal to be reproduced into an acoustic sound radiated into said acoustic space, a cancellation sound signal path connected to said signal source of original sound for taking and passing a signal sample, said cancellation sound signal path including control means with delay, amplification and phase-inversion facilities for the processing of said cancelling sound signal, and at least one cancelling loudspeaker connected to said cancellation sound signal path for generating said cancelling sound and thus attenuating the reflected pressure waves of the original sound radiated into said acoustic space, wherein said apparatus includes signal separation means connected to said cancellation sound signal path for removing such signal components, whose frequency is sufficiently high for forming a diffuse sound field in conjunction with their reproduction in said acoustic space, from said canceling sound signal and thus from the cancelling sound being radiated by said canceling loudspeaker.

12. The sound reproduction apparatus according to claim 11, wherein said signal separation means are adapted to remove signal components having a frequency higher than 200 Hz.

13. The sound reproduction apparatus according to any of claim 11 or 12, wherein said sound reproduction signal path includes a selective frequency band divider integrated with said amplifier for dividing the original signal into separate frequency bands, and said cancellation sound signal path is adapted to pass via said amplifier of the sound reproduction signal path and its integral frequency band divider so that the cancellation sound signal path is passed via the low-frequency band of the band divider, whereby said frequency band divider also acts as said signal separation means.

14. The sound reproduction apparatus according to claim 11 or 12, wherein said cancellation sound signal path includes a low-pass filter acting as said signal separation means.

15. The sound reproduction apparatus according to claim 14, wherein said low-pass filter is connected on said cancellation sound signal path prior to said control means.

16. The sound reproduction apparatus according to claim 11, wherein said control means include a digital delay circuit comprising an AD converter for converting a signal into digital format, memory circuits for storing a digital signal, a DA converter for converting a digital signal back into analog format, and a microcontroller for connecting a digital signal from said AD converter to said memory units and, after the lapse of a set delay time, further from said memory units to said DA converter.

17. The sound reproduction apparatus according to claim 16, wherein said digital delay circuit is adapted to generate a delay which is a function of frequency.

18. The sound reproduction apparatus according to claim 11, wherein at least one of said loudspeakers is a low-frequency radiator such as a subwoofer, and at least one of said cancelling loudspeakers is at least for its frequency response of a similar type of low-frequency.

19. The sound reproduction apparatus according to claim 11 for reproduction of stereophonic or multichannel sounds, wherein said apparatus includes means for combining and passing signals from the different channels in a combined format over said cancellation sound signal path to said control means.

20. The sound reproduction apparatus according to claim 19, wherein said means for combining the signals from the different channels are placed on the cancellation signal path prior to said signal separation means.

* * * * *